(12) United States Patent
Aoki et al.

(10) Patent No.: US 6,884,700 B2
(45) Date of Patent: Apr. 26, 2005

(54) METHOD OF MANUFACTURING DEVICE, DEVICE, AND ELECTRONIC APPARATUS

(75) Inventors: Takashi Aoki, Suwa (JP); Masahiro Furusawa, Chino (JP); Ichio Yudasaka, Chino (JP)

(73) Assignee: Seiko Epson Corporation (JP)

( * ) Notice: Subject to any disclaimer, the term of this patent is extended or adjusted under 35 U.S.C. 154(b) by 64 days.

(21) Appl. No.: 10/420,525

(22) Filed: Apr. 22, 2003

(65) Prior Publication Data

US 2004/0029364 A1 Feb. 12, 2004

(30) Foreign Application Priority Data

Apr. 22, 2002 (JP) .................................... 2002-119962

(51) Int. Cl.[7] .......................... H01L 21/20; H01L 21/36
(52) U.S. Cl. ...................... 438/502; 438/301; 438/478; 438/500; 438/501
(58) Field of Search ..................... 438/197, 299, 438/301, 478, 500, 501, 502

(56) References Cited

U.S. PATENT DOCUMENTS 6,514,801 B1 * 2/2003 Yudasaka et al. ........... 438/151
6,518,087 B1 * 2/2003 Furusawa et al. ............ 438/96
6,734,029 B1 * 5/2004 Furusawa ..................... 438/22
6,767,775 B1 * 7/2004 Yudasaka et al. ........... 438/156
2002/0132454 A1 * 9/2002 Ohtsu et al. ................. 438/486

* cited by examiner

*Primary Examiner*—Amir Zarabian
*Assistant Examiner*—Thanh Y. Tran
(74) *Attorney, Agent, or Firm*—Harness, Dickey & Pierce, P.L.C.

(57) ABSTRACT

A method of manufacturing a device comprising individual thin films including a silicon film, a gate insulating film, a conductive film for a gate electrode, an interlayer insulating film, and a conductive film for an electrode and wiring, comprising: a step of applying a liquid material to form an applied film; and a heat treatment and/or a light irradiating treatment of making the applied film into the silicon film, wherein, as the liquid material, a high-order silane composition comprising a high-order silence formed by photopolymerization by irradiating a silane compound solution having a photopolymerization property with UV rays is used.

31 Claims, 8 Drawing Sheets

METHOD OF MANUFACTURING DEVICE, DEVICE, AND ELECTRONIC APPARATUS

BACKGROUND OF THE INVENTION

1. Technical Field of the Invention

The present invention relates to a method of manufacturing a device which is employed in electronic apparatuses, such as a liquid crystal display device (for example, a small-sized LCD or a large-sized LCD), a self light-emitting display device (for example, an organic EL display or a plasma display), and an LSI, and more specifically, to a method of manufacturing a device by forming thin films constituting the device using liquid materials, to a device obtainable through the method, and to an electronic apparatus comprising the device.

2. Description of the Related Art and Problems to be Solved by the Invention In general, devices such as a thin film transistor comprise thin films, such as a semiconductor film, an insulating film or a conductive film. In a liquid crystal display device or the like, a transparent conductive film is also employed except the above films. Classifying these thin films in terms of their function, the insulating film includes a gate insulating film, and an interlayer insulating film, and the conductive film includes areas used as a gate electrode, source/drain electrodes, a pixel electrode and wiring.

As the semiconductor film, silicon films such as an amorphous silicon film or a poly-silicon film are mainly used. Conventionally, it is generally known that a device such as a thin film transistor using silicon was manufactured through the processes of forming a silicon film on the whole surface through a vacuum process such as a chemical vapor deposition (CVD) method, or a sputtering method and then removing unnecessary portions through photolithography. However, the CVD method has problems in that a large-scaled apparatus is required, the utilization efficiency of raw materials is low, the handling is difficult due to the use of gaseous raw materials, and a large quantity of waste is produced. Also, the sputtering method has problems common to the CVD method in that the film thickness at an uneven portion on a surface of a substrate is non-uniform, the productivity is low, and an apparatus is large-scale and expensive due to the required vacuum apparatus.

Recently, in place of such methods, a method of fabricating (or forming) a silicon film by applying a liquid high-order silane or a solution thereof to a substrate and by heating it or irradiating it with UV rays has been suggested. According to this method, the handling is easier due to the use of liquid raw materials and the silicon film can be formed at lower cost since a large-sized apparatus is not required. Further, by patterning the solution of high-order silane through the ejection of a droplet, the number of processes and the waste of material involved in the photolithography can be reduced.

A method of forming a silicon-group thin film by liquefying a gaseous raw material to cause it to be adsorbed onto a cooled substrate and then by causing it to react to atomic hydrogen in chemical activation is disclosed in Japanese Unexamined Patent Application Publication No. 1-29661. However, this method has the following problems. That is, since vaporizing and cooling silicon hydride as a raw material is carried out continuously, a complicated apparatus is not only required but also the control of film thickness is difficult.

Further, a method of forming a silicon film by applying liquid silicon hydride onto a substrate and heating it or irradiating it with UV rays is disclosed in Japanese Unexamined Patent Application Publication Nos. 5-1447141 and 7-267621. However, in this method, since materials having a low molecular weight are used, the system is unstable and thus the handling thereof is difficult. Furthermore, since the solution used in this method has a bad wettability to the substrate, the application thereof to the substrate is inherently difficult. In addition, since the materials have a low molecular weight, the boiling point thereof is low and thus the solution is vaporized prior to the formation of the silicon film during heating, so that it is very difficult to obtain a desired film. In other words, the way in which the high-order silane (of which the wettability is excellent, whose boiling point is high and which is secure) is used as the materials is a very important factor during the formation of a film.

As one solution thereof, a method for improving the wettability of a solution by thermally decomposing or photo-decomposing a mixture of high-order silane and a catalyst prior to the applying treatment is attempted in Japanese Unexamined Patent Application Publication No. 10-321536. However, in this method, there is a problem in that since mixing the catalyst such as nickel with the solution is required, features of the silicon film are remarkably deteriorated.

Generally, the composing order and the refining process are very difficult in a method of directly composing a silane compound having a large molecular weight. Although a method of directly composing the high-order silane by photopolymerization has also been attempted as disclosed in Japanese Unexamined Patent Application Publication No. 11-260729, the yield rate of $Si_9H_{20}$ is very low and such molecule size is still insufficient for the manifestation of performance such as wettability.

On the other hand, in a method of forming the silicon film containing n-type or p-type dopants, generally, the dopants are introduced using an ion implantation method after forming the silicon film. On the contrary, a method of forming a doped silicon film by mixing a dopant source with a material liquid during the formation of a silicon film made of the aforementioned high-order silane is disclosed in Japanese Unexamined Patent Application Publication No. 2000-31066. However, even in this method, since there are basic problems due to the use of the low molecule group material that the high-order silane solution is vaporized and reduced during heating and thus the dopant source is vaporized, it is difficult to effectively add the dopant.

Furthermore, even in forming the insulating film such as the gate insulating film or the interlayer insulating film or the conductive film for the electrode such as the gate electrode or the source/drain electrodes, which are used for a device such as a thin film transistor, the thermal CVD method, the plasma CVD method and the sputtering method are widely used similar to the aforementioned formation of the silicon film. The conductive film used for the device such as the thin film transistor is used as the gate electrode, the source/drain electrodes, wiring for connecting the electrodes to each other or power source wiring, and a metal film or a metal silicide film comprising Al, Cu, Cr, Ta or the like is used as a method of forming the conductive film. The conventional sputtering method is widely used for formation of the metal film or the silicide film. The device such as a thin film transistor used for a liquid crystal display device requires a transparent conductive film in addition to the conductive film. In general, the transparent conductive film includes an ITO film and is formed through the sputtering method similar to the formation of the metal film. However, the CVD method or the sputtering method still has the aforementioned problems.

Therefore, an object of the present invention is to provide a method of manufacturing a device at low cost using a small-sized and inexpensive apparatus, where the productivity is high, the defect rate is reduced, the production efficiency is high, disconnection does not occur in a stepped portion and the thin film is formed at low cost.

SUMMARY

The present invention provides a method of manufacturing a device comprising individual thin films including a silicon film, a gate insulating film, a conductive film for a gate electrode, an interlayer insulating film, and a conductive film for an electrode and wiring, wherein a process of forming the silicon film comprises a step of applying a liquid material to form an applied film; and a heating and/or light irradiating step for making the applied film into the silicon film, and wherein, as the liquid material, a high-order silane composition comprising a high-order silane formed by photopolymerization by irradiating with UV rays a silane compound solution having a photopolymerization property is used, thereby solving the above problems.

Further, the present invention provides a method of manufacturing a device comprising individual thin films including a silicon film, a gate insulating film, a conductive film for a gate electrode, an interlayer insulating film, a conductive film for an electrode and wiring, and a transparent conductive film, wherein a process of forming the silicon film comprises a step of applying a liquid material to form an applied film; and a heating and/or light irradiating step for making the applied film into the silicon film, and wherein, as the liquid material, a high-order silane composition comprising a high-order silane formed by photopolymerization by irradiating with UV rays a silane compound solution having a photopolymerization property is used.

Further, the present invention provides a method of manufacturing a device, comprising: a step of applying a liquid material on an insulating substrate or an insulating film to form an applied film; a heating and/or light irradiating step for making the applied film into a silicon film; a step of patterning the silicon film to form island regions which will become a source, a drain, and a channel; a step of forming a gate insulating film; a step of forming a gate electrode; a step of forming a doped silicon film which will become source/drain regions; a step of forming an interlayer insulating film; a step of opening the interlayer insulating film to form a contact hole; and a step of forming an electrode and wiring, wherein, as the liquid material, a high-order silane composition comprising a high-order silane formed by photopolymerization by irradiating with UV rays a silane compound solution having a photopolymerization property is used.

Furthermore, the present invention provides a method of manufacturing a device, comprising: a step of forming a dopant-containing semiconductor layer which will become source/drain regions, on an insulating substrate or an insulating film; a step of applying a liquid material on the substrate to form an applied film; a heating and/or light irradiating step for making the applied film into a silicon film; a step of patterning the silicon film to form an island region which will become a channel region connected to the source/drain regions; a step of forming a gate insulating film; a step of forming a gate electrode; a step of forming an interlayer insulating film; a step of opening the interlayer insulating film to form a contact hole; and a step of forming an electrode and wiring, wherein, as the liquid material, a high-order silane composition comprising a high-order silane formed by photopolymerization by irradiating with UV rays a silane compound solution having a photopolymerization property is used.

Further, the present invention provides a method of manufacturing a device, comprising: a step of forming a gate electrode on an insulating substrate or an insulating film; a step of forming a gate insulating film; a step of applying a liquid material on the substrate to form an applied film; a heating and/or light irradiating step for making the applied film into a silicon film; a step of forming a dopant-containing semiconductor layer which will become source/drain regions; and a step of forming an electrode and wiring, wherein, as the liquid material, a high-order silane composition comprising a high-order silane formed by photopolymerization by irradiating with UV rays a silane compound solution having a photopolymerization property is used.

Further, the present invention provides the method of manufacturing a device, wherein the heating and/or light irradiating step comprises a first heating and/or light irradiating step for making the applied liquid material into an amorphous silicon film and a second heating step for making the amorphous silicon film into a polycrystalline silicon film.

Further, the present invention provides the method of manufacturing a device, wherein the first heating and/or light irradiating step comprises a step of irradiating light having a wavelength of 170 nm to 380 nm.

Further, the present invention provides the method of manufacturing a device, wherein the first heating step comprises a step of removing a solvent contained in the applied film formed by the liquid material and a step for making the applied film into the amorphous silicon film by heating the applied film at a temperature higher than that used in the step of removing the solvent.

Further, the present invention provides the method of manufacturing a device, wherein the second heating step comprises a step of heating at a high temperature for a short time with intense light such as lamp annealing or laser annealing.

Further, the present invention provides the method of manufacturing a device, the process of forming the silicon film comprising the step of applying the liquid material to form the applied film and the heating and/or light irradiating step for making the applied film into the silicon film, wherein all the steps are carried out in an oxygen-free atmosphere.

Further, the present invention provides the method of manufacturing a device, wherein the step of heating at a high temperature for a short time with intense light, such as lamp annealing or laser annealing, is carried out in an oxygen-free atmosphere.

Further, the present invention provides the method of manufacturing a device, wherein the oxygen-free atmosphere has an oxygen concentration of 10 ppm or less.

Further, the present invention provides the method of manufacturing a device, wherein the step of forming the gate insulating film comprises a step of applying polyperhydrosilazane on the substrate; and a step for making the applied polyperhydrosilazane into a $SiO_2$ film through a heat treatment.

Further, the present invention provides the method of manufacturing a device, wherein the step of forming the gate electrode comprises a step of applying a metal-contained liquid material on the substrate to form an applied film; and a step for making the applied film into a metal film through a heat treatment.

Further, the present invention provides the method of manufacturing a device, wherein the step of forming the gate electrode comprises a step of forming a metal film on the substrate through a plating method.

Further, the present invention provides the method of manufacturing a device, wherein the step of forming the gate electrode comprises a step of applying an organic compound containing indium and tin on the substrate to form an applied film; and a heating step for making the applied film into an ITO (Indium-Tin-Oxide) film.

Further, the present invention provides the method of manufacturing a device, wherein the step of forming the interlayer insulating film comprises a step of applying polyperhydrosilazane on the substrate; and a step for making the polyperhydrosilazane into an $SiO_2$ film through a heat treatment.

Further, the present invention provides the method of manufacturing a device, wherein the step of forming the electrode and the wiring comprises a step of applying a metal-contained liquid material on the substrate to form an applied film; and a step for making the applied film into a metal film through a heat treatment.

Further, the present invention provides the method of manufacturing a device, wherein the step of forming the electrode and the wiring comprises a step of forming a metal film on the substrate through a plating method.

Further, the present invention provides the method of manufacturing a device, wherein the step of forming the electrode and the wiring comprises a step of applying an organic compound containing indium and tin on the substrate to form an applied film; and a heating step for making the applied film into an ITO (Indium-Tin-Oxide) film.

Further, the present invention provides the method of manufacturing a device, wherein the step of forming the transparent conductive film comprises a step of applying an organic compound containing indium and tin on the substrate to form an applied film; and a heating step for making the applied film into an ITO (Indium-Tin-Oxide) film.

Further, the present invention provides the method of manufacturing a device, wherein the high-order silane composition used as the liquid material comprises a high-order silane whose boiling point is higher than a decomposing point.

Further, the present invention provides the method of manufacturing a device, wherein the high-order silane composition is formed by using UV rays having a wavelength at which the solvent used in the silane compound solution is not decomposed.

Further, the present invention provides the method of manufacturing a device, wherein the high-order silane composition is formed by irradiating with UV rays for 0.1 seconds to 120 minutes.

Further, the present invention provides the method of manufacturing a device, wherein the high-order silane composition is formed using a compound having at least one ring-shaped structure within a molecule as the silane compound.

Further, the present invention provides the method of manufacturing a device, wherein the high-order silane composition is formed using a compound expressed as a general formula $Si_nX_{2n}$ (where X represents a hydrogen atom and/or a halogen atom and n represents an integer of 3 or more).

Further, the present invention provides the method of manufacturing a device, wherein the high-order silane composition is formed by adding a material containing a Group IIIB element in the periodic table or a material containing a Group VB element in the periodic table after irradiating with UV rays, or by adding to the silane compound solution a material containing a Group IIIB element in the periodic table or a material containing a Group VB element in the periodic table before irradiating with UV rays.

Further, the present invention provides the method of manufacturing a device comprising individual thin films including the silicon film, the gate insulating film, the conductive film for the gate electrode, the interlayer insulating film, and the conductive film for the electrode and wiring, wherein all of the thin films are formed using liquid materials and all of the thin films are formed without using a vacuum apparatus.

Further, the present invention provides the method of manufacturing a device comprising individual thin films including the silicon film, the gate insulating film, the conductive film for the gate electrode, the interlayer insulating film, and the conductive film for the electrode and wiring, wherein all of the thin films are formed using liquid materials and all of the thin films are formed under atmospheric pressure or under a pressure close thereto.

Further, the present invention provides the method of manufacturing a device comprising individual thin films including the silicon film, the gate insulating film, the conductive film for the gate electrode, the interlayer insulating film, and the conductive film for the electrode and wiring, wherein all of the thin films are formed using liquid materials, and at least the silicon film, the conductive film for the gate electrode and the conductive film for the electrode and wiring are formed in island shapes (i.e., isolatedly) by using a droplet ejection method.

Further, the present invention provides the method of manufacturing a device comprising individual thin films including the silicon film, the gate insulating film, the conductive film for the gate electrode, the interlayer insulating film, the conductive film for the electrode and wiring, and the transparent conductive film, wherein all of the thin films are formed using liquid materials and all of the thin films are formed without using a vacuum apparatus.

Further, the present invention provides the method of manufacturing a device comprising individual thin films including the silicon film, the gate insulating film, the conductive film for the gate electrode, the interlayer insulating film, the conductive film for the electrode and wiring, and the transparent conductive film, wherein all of the thin films are formed using liquid materials and all of the thin films are formed under atmospheric pressure or under a pressure close thereto.

Further, the present invention provides the method of manufacturing a device comprising individual thin films including the silicon film, the gate insulating film, the conductive film for the gate electrode, the interlayer insulating film, the conductive film for the electrode and wiring, and the transparent conductive film, wherein all of the thin films are formed using liquid materials, and at least the silicon film, the conductive film for the gate electrode, the conductive film for the electrode and wiring and the transparent conductive film are formed in island shapes by using a droplet ejection method.

Further, the present invention provides a device manufactured through the above method of forming a device.

Further, the present invention provides an electronic apparatus comprising the above device.

DETAILED DESCRIPTION

Now, the present invention will be described in detail.

The method of manufacturing a device according to the present invention may include a method of manufacturing a thin film transistor as an embodiment. Now, although the method of manufacturing a thin film transistor will be described as an embodiment of the method of manufacturing a device according to the present invention, the present invention is not limited to this but is applicable to methods of manufacturing other various devices.

Further, in the present invention, a "droplet ejection method" is a method of forming a desired pattern, including an ejected material, by ejecting droplets to a desired region and may be referred to as an inkjet method. In this case, the droplet to be ejected is not so-called ink used for printing but a liquid material containing materials constituting the device. For example, the materials include one capable of functioning as a conductive material or an insulating material constituting the device. Further, a "droplet ejection" is not limited to ejection by atomization but includes continuous ejection of the liquid material drop by drop.

The thin film transistor to be obtained according to the method of manufacturing a thin film transistor according to this embodiment comprises as each thin film, a silicon film, an insulating film, a conductive film and a transparent conductive film if it is used for a liquid crystal display device. The configuration of the thin film transistor according to this embodiment is similar to that of the thin film transistor generally used.

First, a conventional method will be described prior to describing the manufacturing method according to the present invention.

Figure 1:
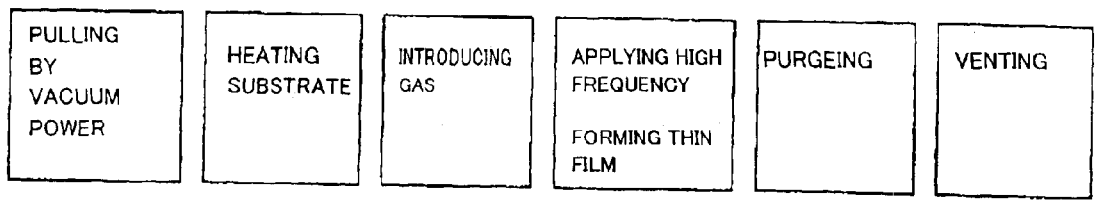
FIG. 1 is a view illustrating a process of forming a thin film by using the conventional CVD method.

FIG. 1 illustrates a standard process for forming a film through the conventional CVD method. A substrate set in a CVD apparatus is moved into a load lock room, and is pulled by vacuum power. Thereafter, the substrate is moved to a heating chamber and heated. Then, the substrate is moved to a process chamber and then a film is formed thereon. In the process chamber, a heating mechanism for maintaining the temperature of the substrate is provided, the process gas required for the film formation is introduced into the chamber, the radio frequency is applied to the substrate after the pressure is stabilized, and the introduced gas is formed into a plasma state, thereby forming a film. After having formed a film, the residual process gas is purged, the substrate is moved into the load lock room, the load lock room is vented and then the substrate is taken out. Since many process gases used for the CVD method have toxicity or combustibility, the CVD also apparatus requires a leak detector for the gases or an apparatus for making exhaust gases harmless for the purpose of safety control. Further, in the purge process, the gases having toxicity and combustibility are required to be sufficiently purged and thus it takes quite a time to complete the film forming process.

In the sputtering method, also, a film is formed through almost the same processes as in the CVD method shown in FIG. 1. The sputtering method is different from the CVD method in that the gas used is mainly an inert gas such as Ar and a gas having toxicity and combustibility is rarely used, and in that as the plasma power source for sputtering, not the radio frequency power but the DC power source is often used. These differences are very small from the viewpoint of the whole processes or overall comparison of the equipment structure, and the sputtering method has problems similar to those of the CVD method in that the equipment has large scale and the productivity thereof is low.

On the other hand, in the present invention, the thin film is formed out of the liquid material. The main method comprises an applied film formation process for applying the liquid material onto the substrate and a heat treatment for making the applied film a desired functional film. A spin coating method, a roll coating method, a curtain coating method, a deep coating method, a spraying method, or a droplet ejection method is used for forming the applied film. Since a basic configuration of the applicator used for such methods comprises only a stage or a holder for holding a substrate and a mechanism for applying a liquid onto the substrate, the configuration of the applicator is very simple. It should be understood that apparatuses used for the heating and/or light-irradiating treatment for denaturing the applied film into the functional film includes a heating apparatus such as an oven, a baking furnace, an annealing furnace or a light-irradiating apparatus using a halogen lamp or a UV lamp as a light source, thus these apparatuses have a simple structure as well.

Figure 2:
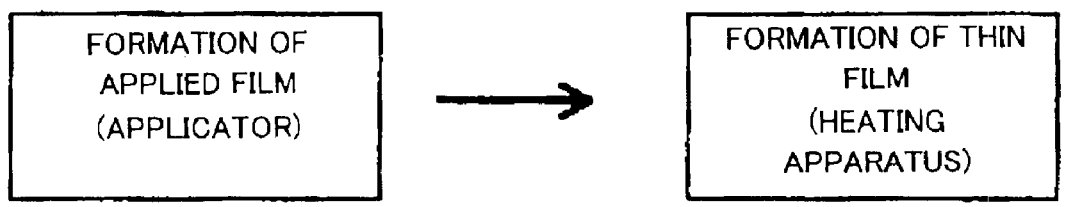
FIG. 2 is a view illustrating a process of forming a thin film out of a liquid material.
Figure 3:
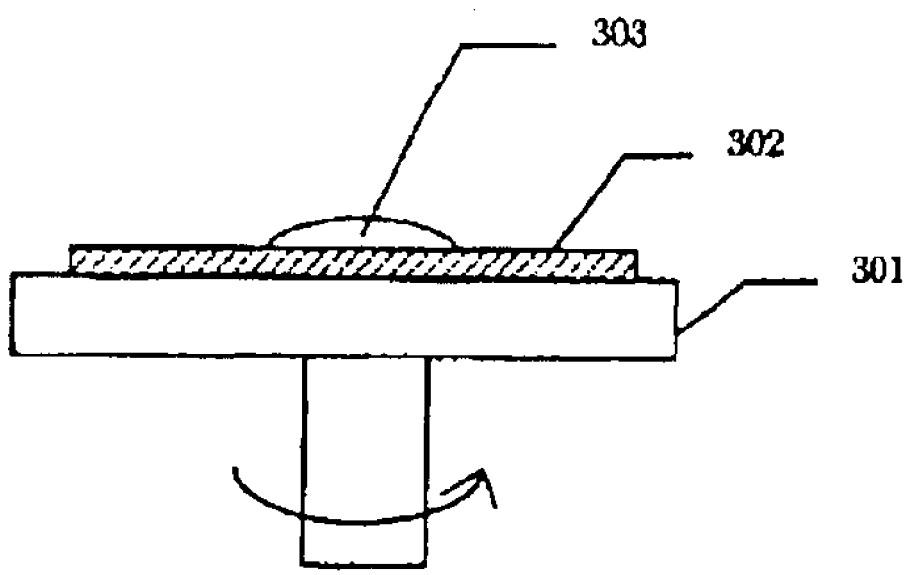
FIG. 3 is a view illustrating a process of forming an applied film out of a liquid material.

FIG. 2 is a view illustrating one aspect of the method of forming a thin film out of the liquid material. Depending upon liquid materials to be used, the atmosphere control is required for formation of an applied film and a thin film and the formation is basically carried out under the atmospheric pressure. Compared to film forming processes according to the conventional CVD method or the conventional sputtering method shown in FIG. 2, it will be understood how short the processes of the method of forming the thin film according to the present invention are. Furthermore, for example, the apparatus for forming an applied film according to the spin coating method may comprise only a rotatable stage 301 and a mechanism for dropping a liquid material 303 on a substrate 302, as shown in FIG. 3. The heating apparatus comprises a stage or holder onto which the substrate is set and a heating mechanism. Therefore, it can be understood that the apparatus used for the present invention is smaller and less expensive than the conventional CVD apparatus or the conventional sputtering apparatus.

Like the above, according to the present invention, the above problems inherent to the conventional method for forming a film are solved, and thus it is possible to manufacture a thin film transistor at low cost using a small-sized and inexpensive apparatus, where the productivity is high, the defect is reduced, the yield rate is high, the disconnection does not occur in a stepped portion and the thin film is formed at low cost.

In the method of forming the thin film transistor according to this embodiment, as described above, all or a part of the respective thin films of a silicon film, an insulating film, and a conductive film constituting the thin film transistor are formed out of liquid materials. The basic forming process comprises a step of applying a liquid material to a substrate to form an applied film and a step for making the applied film into a thin film through a heat treatment and may comprise a step of immersing the substrate in the liquid material to form a desired thin film on the surface of the substrate.

In the method of forming a thin film transistor according to this embodiment, an applied liquid material used for forming a silicon film is a composition containing high-order silane as a photopolymer obtained by photopolymerization by irradiating an ultra violet ray (hereinafter, may be referred to as "UV") to a solution of silane compound having a photopolymerization property. This high-order silane is formed by irradiating UV to a solution of specific silane compound having such photopolymerization property like above to photo-polymerize the silane compound and molecular weight thereof (molecular weight of about 1800 is confirmed) is incomparably greater than that of the high-order silane (for example, molecular weight of $Si_6H_{14}$ is 182) which has been used in the conventional method of forming the silicon film. Since the high-order silane having such enormous molecular weight has a boiling point higher than the decomposing point and thus a film can be formed before it is vaporized to disappear, and it is possible to form a silicon film more effectively than the conventional method.

Further, since if this high-order silane is actually heated, it is decomposed before it reaches the boiling point, it is impossible to experimentally determine the boiling point higher than the decomposing point. However, this boiling point means a boiling point at the normal pressure as a theoretical value obtained from the dependency of vapor pressure on temperature or a theoretical computation.

Furthermore, if the high-order silane composition according to the present invention is employed, the conventional rapid heat treatment at a high temperature before it is vaporized as in the prior art is not required because the boiling point of the high-order silane is higher than the decomposing point. This means that it is possible to increase the temperature slowly and it can be heated at a relative low temperature during decompression. With this change, the bonding speed between silicon and silicon in forming the silicon film can be controlled and in addition that the solvent which is a cause of characteristic deterioration of silicon in the silicon film can be more effectively reduced than the conventional method, by maintaining the temperature higher than the boiling point of the solvent, even if it is not high in forming silicon film.

In the method of forming a thin film transistor according to this embodiment, since the liquid material (high-order silane solution) comprising the aforementioned high-order silane composition is used as the applying material, it is possible to manufacture the thin film transistor easily and inexpensively, by applying the composition and then forming a thin silicon film through a heating, light irradiating or laser irradiating treatment.

It is preferable that the high-order silane contained in the high-order silane composition has the boiling point higher than the decomposing point thereof as described above. This high-order silane having the boiling point higher than the decomposing point can be easily obtained, by selecting a preferable silane compound, which will be described later, as the silane compound that is a raw material, or by selecting a UV having a preferable wavelength, which will be described later, as the irradiating UV, an irradiating time, an irradiating method, an irradiating energy, a solvent and a refining method after irradiation of UV.

In the present invention, the distribution of molecular weight of the high-order silane can be controlled through the irradiating time, the irradiating amount and the irradiating method of UV. Further, by irradiating UV to the silane compound and then separating/refining it by using GPC that is a general refining method of polymer, a high-order silane compound having any molecular weight can be extracted. Furthermore, the refining process can be carried out by using difference in solubility between high-order silane compounds having different molecular weight. Furthermore, the refining process can be carried out through the fractionating method using difference in boiling point between high-order silane compound having different molecular weight at the normal pressure or a decompressed pressure. By doing so, since the molecular weight of the high-order silane compound in the high-order silane composition can be controlled, a high-quality silicon film of which characteristic nonuniformity is suppressed can be obtained.

As the molecular weight of high-order silane becomes greater, the boiling point thereof becomes higher and the solubility to solvent becomes lower. For this reason, the high-order silane after photopolymerization may not be dissolved in the solvent and may be segregated in accordance with the irradiating conditions of UV. In this case, by removing insoluble components through a method such as filtering with a micro filter, the high-order silane composition can be refined.

It is preferable that the UV irradiated to the silane compound solution have a wavelength in which the solvent is not decomposed. Specifically, the wavelength thereof is preferably 250 nm or longer, more preferably 300 nm or longer. In the present inventions the "wavelength in which the solvent is not decomposed" means a wavelength in which the chemical bonding among the solvent molecules is not cut by means of the UV irradiation. Since impure atoms such as carbon atoms resulting from the solvent can be prevented from being doped into the silicon film after the heating and/or light irradiating treatment by use of UV having the aforementioned wavelength range, it is possible to obtain a silicon film having a better characteristic.

It is preferable that the irradiating time of UV is 0.1 seconds to 120 minutes, more preferably 1 to 30 minutes, in that the high-order silane having a desired distribution of molecular weight can be obtained.

Further, it is preferable that the irradiating method of UV is to irradiate UV after diluting the silane compound with a solvent or to irradiate UV uniformly to the whole solution while agitating the silane compound solution, in that the high-order silane having a desired distribution of molecular weight can be obtained.

Furthermore, the viscosity and the surface tension of the high-order silane composition used as the liquid material can be easily controlled through the adjustment of the solvent in addition to the adjusting method relating to the distribution of molecular weight of the high-order silane. This is very advantageous during the patterning using the droplet ejection that is a best merit when the silicon film is formed out of liquid.

The silane compound for preparing the high-order silane composition used as the liquid material is not specifically limited provided that it has the photopolymerization property capable of being polymerized through the UV irradiation, and includes, for example, the silane compounds expressed by a general formula of $Si_nX_m$ (where n is an independent integer of 3 or more, m is an independent integer of 4 or more and X is a substituent such as hydrogen atom and/or halogen atom).

Specifically, this silane compound includes a ring-shaped silane compound expressed by a general formula $Si_nX_{2n}$ (where n is an integer of 3 or more and X is hydrogen atom and/or halogen atom), or a silane compound having two or more ring-shaped structures expressed by a general formula $Si_nX_{2n-2}$ (where n is an integer of 4 or more and X is hydrogen atom and/or halogen atom), and in addition, all the silane compounds, to which the photo-polymerizing process through the UV irradiation according to the present invention is applicable, having the photopolymerization property such as silicon hydride having at least one ring-shaped structure and a halogen substituent thereof.

Specifically, the silane compound has one ring-shaped structure and which includes cyclotrisilane, cyclotetrasilane, cyclopentasilane, or cyclohexasilane, cycloheptasilane. The silane compound further has two ring-shaped structure and which includes 1,1'-bicyclobutasilane, 1,1'-bicyclopentasilane, 1,1'-bicyclohexasilane, 1,1'-bicycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3, 3]heptasilane, spiro[4, 4]nonasilane, spiro[4, 5]decasilane, spiro[4, 6]undecasilane, spiro[5, 5]undecasilane, spiro[5, 6]undecasilane, spiro[6, 6]tridecasilane, and in addition, includes silicide of which hydrogen atom of their skeleton is partially substituted with $SiH_3$ group or halogen atom. Two or more kinds of these may be mixed for use.

Among these, since the silane compound having at least one ring-shaped structure in a molecule has extremely great reactivity to light and the photopolymerization thereof can be efficiently carried out, it is preferable that it is used as a raw material. Among them, the silane compound expressed by $Si_nX_{2n}$ (where n is an integer of 3 or more and X is halogen atom such as hydrogen atom and/or fluorine atom, chlorine atom, bromine atom, iodine atom) such as cyclotetrasilane, cyclopentasilane, cyclohexasilane, cycloheptasilane is more preferable, because of the easiness of synthesis and refinement thereof is easy in addition to the above reasons.

On the other hand, although it is preferable that the aforementioned silane compound having the ring-shaped structure is used as a silane compound, provided that it does not hinder the photo-polymerizing process through the UV irradiation according to the present invention, the silane compound such as n-pentasilane, n-hexasilane, n-heptasilane or the denatured silane compound denatured by boron atom and/or phosphor atom may be used in combination, as needed.

A solvent for the high-order silane used in the present invention is not specifically limited provided that it dissolves the high-order silane formed by photopolymerization of the above silane compound not to react to the above compound. Such solvent is for forming a solution of the silane compound that is a raw material of the high-order silane composition and can be used from a step before the UV irradiation. The solvent of which vapor pressure at a room temperature is 0.001 to 200 mmHg can be generally used. When the vapor pressure is greater than 200 mmHg, it is difficult to form an excellent applied film because the solvent is vaporized first in forming the applied film through coating. On the other hand, when the vapor pressure is smaller than 0.001 mmHg, it is difficult to obtain a high-quality silicon film even after the heating and/or light irradiating treatment as the subsequent treatment, because the solvent is late dried in forming the applied film through coating similarly and thus the solvent is apt to remain in the coating film of the high-order silane.

Further, it is preferable that the solvent whose boiling point at the normal pressure is the room temperature or higher, yet lower than 250° C. to 300° C. which is the decomposing point of the high-order silane compound is used. By using the solvent having the boiling point lower than the decomposing point of the high-order silane, since only the solvent can be selectively removed through heating without decomposing the high-order silane after application thereof, it is possible to prevent the solvent from remaining in the silicon film, thereby obtaining a high-quality film.

Specific examples of the solvent (solvent contained in the high-order silane solution after the UV irradiation) used in the silane compound solution further includes the hydrocarbon group solvent such as n-hexane, n-heptane, n-octane, n-decane, dicyclopentane, benzene, toluene, xylene, durene, indene, tetrahydronaphtalene, decahydronaphtalene, squalene. The solvent further includes the ether group solvent such as dipropylether, ethyleneglycoldimethylether, ethyleneglycoldiethylether, ethyleneglycolmethylethylether, diethyleneglycoldimethylether, diethyleneglycoldiethylether, diethyleneglycolmethylethylether, tetrahydrofurane, tetrahydropyrane, 1,2-dimethoxyethane, bis(2-methoxyethyle)ether, p-dioxane. The solvent still further includes the polar solvent such as propylenecarbonate, γ-butylolacton, N-methyl-2-pyrrolidone, dimethylformamide, acetnitrile, dimethylsulphoxide. Among these, the hydrocarbon group solvent and the ether group solvent is preferable and the hydrocarbon group solvent is more preferable, from the viewpoint of solubility of the high-order silane and stability of the solution. These solvents may be used as a single or as a mixture of two kinds or more. Since the hydrocarbon group solvent improves the solubility of the high-order silane, the hydrocarbon group solvent is particularly preferable from the viewpoint of preventing the high-order silane from remaining in the solution during the heat treatment or the light irradiating treatment which will be described later.

Furthermore, before irradiating the UV, a material containing Group IIIB element in the periodic table or a material (dopant source) containing Group VB element in the periodic table may be added to the above silane compound solution. The process of doping such dopant source into the silane compound solution and then irradiating the UV is a new process that has not been found in the conventional method. According to this process, bonding of the dopant and the high-order silane at molecule level is caused through the UV irradiation, the solution is applied to the substrate and the heating and/or light irradiating treatment is carried out, so that it is possible to form an excellent silicon film doped with n-type or p-type. Characteristics of the doped silicon film formed through such process can be further improved by a step of heating etc. In particular, by applying to the substrate the high-order silane solution formed out of the silane compound solution containing this material and carrying out the heat treatment and/or the light irradiating treatment, such material (dopant) can be activated.

A material containing Group IIIB element in the periodic table and a material (dopant source) containing Group VB element in the periodic table includes elements such as phosphor, boron or arsenic, and specifically includes the materials as disclosed in Japanese Unexamined Patent Application Publication No. 2000-31066.

The high-order silane composition used in the manufacturing method of the present invention is a solution containing as a solute the high-order silane which is obtainable by the specific technique as described above and containing as a solvent things exemplified above, and the concentration of the solute is usually about 1 to 80 wt % and can be prepared correspondingly to the desired thickness of silicon film. When the concentration of the solute exceeds 80 wt %, it is difficult to obtain an applied film of which segregation is easy and which is uniform.

Viscosity of the high-order silane prepared like the above ranges from 1 to 100 mpa·s and may be properly selected correspondingly to the applicator or the desired thickness of the applied film. When the viscosity is lower than 1 mpa·s, it is difficult to carry out the coating, and when the viscosity is higher than 100 mpa·s, it is difficult to obtain a uniform applied film.

A small amount of fluorine-group, silicon-group or nonionic-group surface-tension adjusting material may be added to the aforementioned high-order silane solution as needed in a range where the desired function is not damaged. This nonionic group surface-tension adjusting material allows the wettability of the solution to the applying target to be excellent and improves the leveling property of the applied film, so that it is helpful for preventing nonuniformity and surface roughness from being generated in the applied film.

Furthermore, a material containing Group IIIB element in the periodic table or a material containing Group VB element in the periodic table can be added as a dopant source to the high-order silane solution. By properly selecting and adding such material, it is possible to form the desired n-type or p-type silicon film doped with the dopant. In the process for forming the silicon film out of the high-order silane solution added with such material, it is difficult to vaporize the high-order silane due to the high boiling point of the high-order silane and as a result, vaporization of the dopant source can be suppressed. For this reason, the dopant can be doped in the film more efficiently than in the conventional method. Furthermore, as described above, when such material is added to the silane compound solution before the aforementioned UV irradiation to form the high-order silane, it is unnecessary to add such material in the present step (after the UV irradiation). The material containing Group IIIB element in the periodic table and the material containing Group VB element in the periodic table includes the same materials as exemplified as the materials to be added to the silane compound before the UV irradiation. Furthermore, by applying the high-order silane solution to the substrate and then carrying out the heat treatment and/or the light irradiating treatment, such material (dopant) can be activated.

The formation of silicon film in the present invention is carried out not by supplying gas as in the CVD method generally performed but by applying the solution containing the aforementioned high-order silane to the substrate, drying the solvent to form the high-order silane film, and thermal-decomposing and/or photo-decomposing the high-order silane film to convert it into the silicon film.

The applying method of the solution containing the high-order silane includes a spin coating method, a roll coating method, a curtain coating method, a deep coating method, a spraying method, or a droplet ejection method. The applying process is generally carried out at the room temperature or more. The solubility of the high-order silane may be deteriorated at the room temperature or lower and thus a part of the high-order silane may be segregated. Since the silane compound, the high-order silane and the high-order silane composition in the present invention reacts to water and oxygen to be denatured, it is preferable that the process of forming the silicon film out of the high-order silane composition is carried out in the atmosphere of inert gas such as nitrogen, helium, argon where water or oxygen does not exist. Furthermore, it is preferable that the reductive gas such as hydrogen is added as needed. Furthermore, it is preferable that the solvent or additive from which water or oxygen is removed is used.

Although the rate of revolution of the spinner in the spin coating method is determined in accordance with the thickness of the thin film to be formed and the composition of the applying solution, it is usually preferable to be 100 to 5000 rpm, and more preferable to be 300 to 3000 rpm. After the application, the heat treatment is carried out to remove the solvent. Although the heating temperature is varied in accordance with the kind and the boiling point (vapor pressure) of the used solvent, it is usually 100° C. to 200° C. It is preferable that the process is carried out in the same atmosphere of inert gas such as nitrogen, helium or argon as that in the applying process. At that time, by decompressing the whole system, the removal of the solvent may be carried out at the further low temperature. Accordingly, deterioration of the substrate due to heat can be reduced.

In the present invention, the high-order silane is converted into the silicon film through the heating and/or light irradiating treatment. The silicon film obtainable in the present invention is amorphous or polycrystalline. When the temperature in the heat treatment is about 550° C. or lower, the amorphous silicon film is obtained and when the temperature is greater than 550° C., the polycrystalline silicon film is obtained. When it is desired to obtain the amorphous silicon film, it is preferable that the heat treatment is carried out at a temperature between 300° C. to 550° C. and preferably at a temperature ranging from 350° C. to 550° C. When the temperature is less than 300° C., the thermal decomposition of the high-order silane is not carried out sufficiently and as a result, the silicon film may not be formed with a sufficient thickness. It is preferable that the atmosphere in carrying out the heat treatment contains an inert gases such as nitrogen, helium, argon or a reductive gas such as hydrogen. When it is desired to obtain the polycrystalline silicon film, a laser can be irradiated to the obtained amorphous silicon film to convert it into the polycrystalline silicon film. It is preferable that the atmosphere in carrying out the laser irradiating treatment is the inert gases such as nitrogen, helium, argon or the gas formed by adding the reductive gas such as hydrogen to the inert gases and does not contain oxygen.

On the other hand, the light irradiating treatment can be carried out to the applied film of the high-order silane solution in the atmosphere of inert gas before and/or after removing the solvent. The high-order silane soluble in the solvent is converted not only into the tough applied film insoluble in the solvent through a reaction due to the light irradiating treatment but also into the silicon film excellent in electro-optical characteristic after the light irradiating treatment or through the heat treatment at the same time.

In the present invention, the light source used for the light irradiating treatment in converting the high-order silane into the silicon film includes a YAG laser, an argon laser, a carbonic acid gas laser, an excimer laser of XeF, XeCl, XeBr, KrF, or KrCl, ArF and ArCl in addition to a high pressure or low pressure mercurial lamp, a deuterium lamp or a discharge lamp of rare gases such as argon, krypton, xenon. The power output of these light sources is generally 10 to 5000 W and preferably 100 to 1000 W. The wavelength of these light sources is not limited provided that it can be absorbed a little by the high-order silane, and the wavelength is generally 170 nm to 600 nm and preferably 170 nm to 380 nm from the viewpoint of absorption efficiency. In this case, if light having a wavelength of 300 nm or less is irradiated before removing the solvent, since the bonding among atoms in the solvent molecule is cut due to its energy as described above, and as a result, atoms in the solvent, for example, carbons in the hydrocarbon group solvent is contained in the silicon film, it is preferable that the UV irradiation is carried out after removing the solvent. Further, it is more preferable that the laser ray is used from the viewpoint of conversion efficiency into the polycrystalline silicon film. The temperature in this light irradiating treatment is generally room temperature to 500° C. and can be properly selected in accordance with semiconductor characteristics of the silicon film to be obtained.

The substrate to be used is not particularly limited, but the metal substrate made of gold, silver, copper, nickel, titanium, aluminum, or tungsten and the plastic substrate can be used as the substrate, in addition to the conventional quartz, the borosilicate glass and the soda lime glass.

In the present invention, the insulating film is formed through the method using the liquid material as much as possible. The liquid material used for forming the insulating film includes polyperhydrosilazane or SOG. The polyperhydrosilazane has a bonding of Si—N—Si and the SOG has a bonding of Si—O—Si. Both of them are polymers soluble in the organic solvent and is used as the organic solvent solution of liquid, out of which the applied film is formed, on the substrate through a spin coating method, a roll coating method, a curtain coating method, a deep coating method, a spraying method, a droplet ejection method or the like. The method of forming the applied film can be selected depending on the thickness of the insulating film, uniformity of the thickness, or the size or shape of the substrate and the like. Furthermore, in general, although more excellent quality of insulating film is obtained as the heating temperature after forming the applied film becomes higher, the heat treatment should be carried out at a proper temperature in consideration of the heat resistance or the process conditions of the semiconductor device. When the heating temperature is a relative low temperature between 300 to 500° C., the insulating film formed out of the polyperhydrosilazane has better quality than that formed out of the SOG. Furthermore, the insulating film may be formed on the surface of the substrate by immersing the substrate in the liquid material. For example, as disclosed in Japanese Unexamined Patent Application Publication No. 5-259154, by immersing the substrate in the aqueous solution of silicon-hydrofluoric acid and adding boric acid to the aqueous solution, the $SiO_2$ film can be formed on the substrate. When the quality of film remarkably influences the performance of the thin film transistor as the gate insulating film in manufacturing the thin film semiconductor device, the film may be formed through the film forming method using the conventional vacuum apparatus or the thermal oxidation method.

In the present invention, the conductive film is formed through the method using the liquid material as much as possible. The method of forming the conductive film out of the liquid material includes a method comprising a step of applying the liquid material on the substrate through the spin coating method or the like to form the applied film and a step of heating the applied film to make it into the conductive film, and a method of immersing the substrate in the liquid material to form the conductive film on the surface of the substrate. The liquid material used in the method using the applied film includes a dispersion solution formed by dispersing metallic fine particles in the organic solution or a solution formed by dissolving the organic acid solution containing metal in the solvent. It is known that metallic fine particles are used in the dispersion solution and the metal film made of Au or Ag can be formed. The organic acid containing metal may contain In and Sn and the ITO film can be formed. Furthermore, the so-called plating method may be used for the film formation through the, immersing method and the metal film made of Ni, Cu, Au and the like can be formed. In forming the conductive film, in order to secure the contact resistance with the underlying wiring or electrode or the source/drain regions of the thin film transistor, the conductive film may be formed by using the conventional sputtering method or by combining the sputtering method and the method using the liquid material.

According to the present invention, a device manufactured through the aforementioned method of manufacturing a device can be provided. Further, according to the present invention, an electronic apparatus comprising the aforementioned device can be provided. The electronic apparatus of the present invention includes a liquid crystal display device such as a small-sized LCD, or a large-sized LCD, a self light-emitting display device such as an organic EL display apparatus or a plasma display, and an LSI electronic apparatus.

The thin film transistor as an embodiment of the device of the present invention which is obtained through the method of manufacturing a device described above can be used as a switching element of the liquid crystal display device or as a driving element of the organic EL display device. In such application, when a transparent electrode is required, the organic acid compound of indium and tin can be used as the liquid material.

Figure 7:
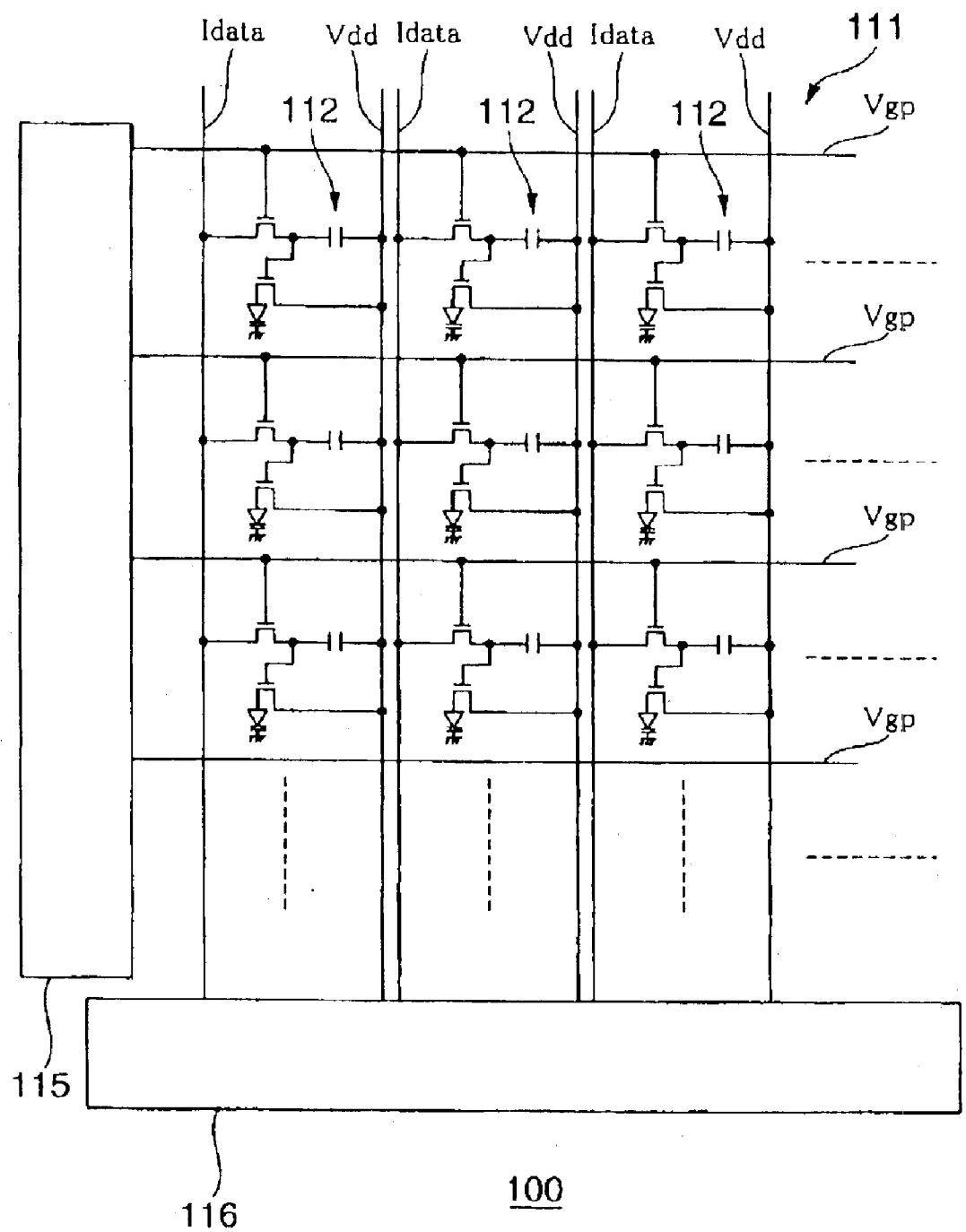
FIG. 7 is an explanatory view illustrating an example of an organic EL display device employing the device according to the present invention.

FIG. 7 is a circuit diagram of a pixel area (display panel) 111 of an electro-optical apparatus 100 driven in an active matrix way, where each pixel 112 comprises a light emitting layer capable of emitting light through the electroluminescent effect and two thin film transistors and a storage capacitor for driving the layer. Through the present invention, the two thin film transistors and the storage capacitor having a structure similar to that of the thin film transistor can be formed. Each selection signal line Vgp is connected from a scanning line driver 115 to each pixel. A signal line Idata and a power source line Vdd are connected from a data line driver 116 to each pixel. By controlling the selection signal line Vgp and the signal line Idata, the current program to each pixel is carried out to control the luminescence of a light emitting portion.

The device of the present invention is applicable to various electronic apparatuses comprising the electro-optical apparatus. FIGS. 8(a) to 8(f) illustrate such electronic apparatus to which the electro-optical apparatus is applicable.

Figure 8:
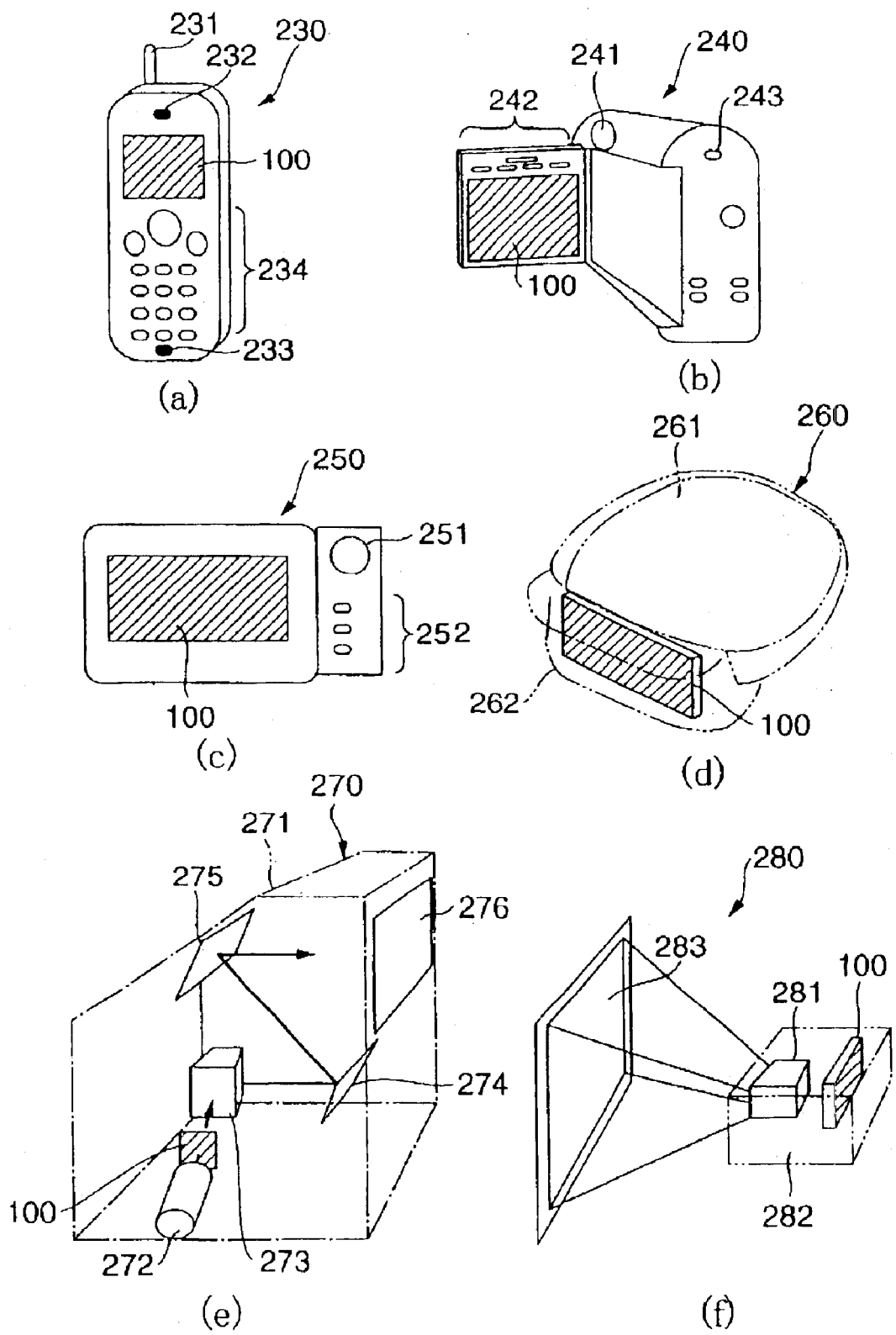
FIGS. 8a–8f are explanatory views illustrating examples of electronic apparatuses comprising an electro-optical apparatus employing the device according to the present invention.

FIG. 8(a) shows an application to a mobile phone, where a mobile phone 230 comprises an antenna unit 231, a voice output unit 232, a voice input unit 233, a manipulation unit 234 and the electro-optical apparatus 100 of the present invention. As such, the electro-optical apparatus 100 of the present invention can be used as a display unit of the mobile phone 230.

FIG. 8(b) shows an application to a video camera, where a video camera 240 comprises an image receiving unit 241, a manipulation unit 242, a voice input unit 243 and the electro-optical apparatus 100 of the present invention. As such, the electro-optical apparatus of the present invention can be used as a display unit or a finder.

FIG. 8(c) shows an application to a portable PC, where a computer 250 comprises a camera unit 251, a manipulation unit 252 and the electro-optical apparatus 100 of the present invention. As such, the electro-optical apparatus of the present invention can be used as a display unit.

FIG. 8(d) shows an application to a head mount display, where a head mount display 260 comprises a band 261, an optical system receiving unit 262 and the electro-optical apparatus 100 of the present invention. As such, the electro-optical apparatus of the present invention can be used as an image display source.

FIG. 8(e) shows an application to a rear type projector, where a projector 270 comprises a casing 271, a light source 272, a synthetic optical system 273, a mirror 274, a mirror 275, a screen 276 and the electro-optical apparatus 100 of the present invention. As such, the electro-optical apparatus of the present invention can be used as an image display source.

FIG. 8(f) shows an application to a front type projector, where a projector 280 comprises a casing 282, an optical system 281 and the electro-optical apparatus 100 of the present invention and can be constructed to display image on a screen 283. As such, the electro-optical apparatus of the present invention can be used as an image display source.

Not limited to the above applications, the electro-optical apparatus 100 of the present invention is applicable to all the electronic apparatuses in which the active matrix type display device can be used. The electro-optical apparatus 100 of the present invention can be employed in a facsimile having a display function, a finder of a digital camera, a portable television, a DSP apparatus, a PDA, an electronic notebook, an electronic display board, or an advertising display.

EMBODIMENTS

Now, although the present invention will be described in detail in conjunction with embodiments, the present invention is not limited to such embodiments.

First Embodiment

Figure 4:
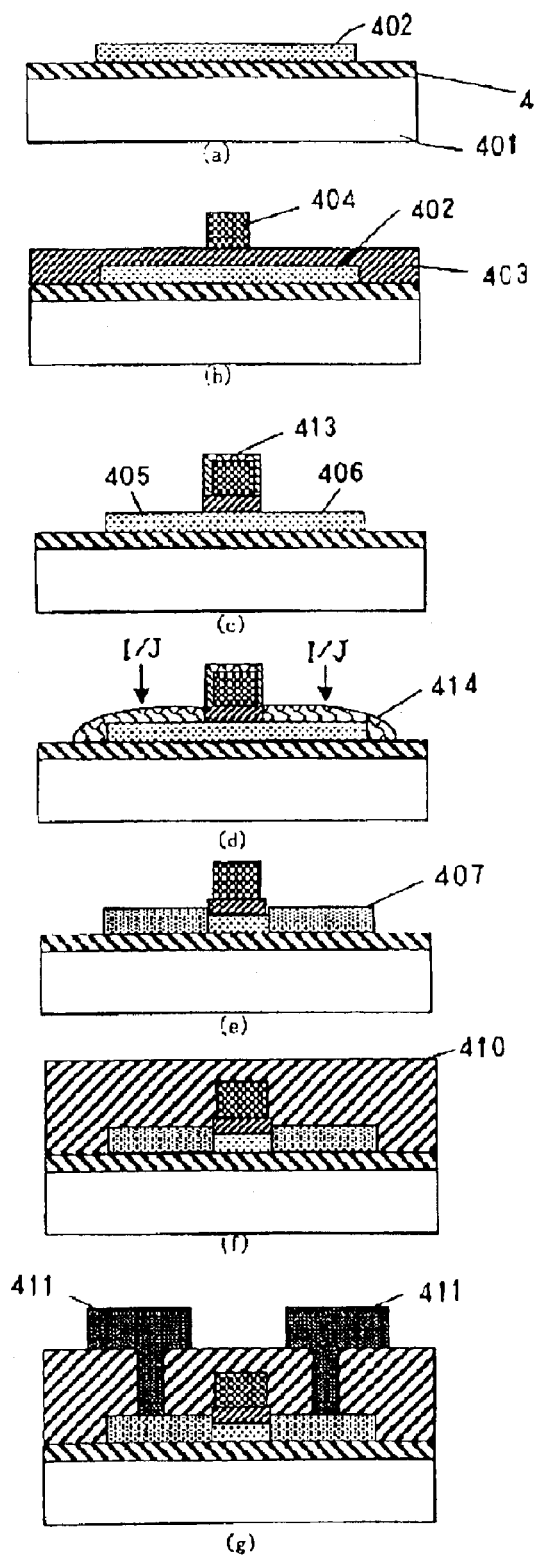
FIGS. 4a–4g are cross-sectional views illustrating a process of manufacturing a coplanar type thin film transistor according to a first embodiment of the present invention.

A first embodiment of the present invention is shown in FIG. 4. FIG. 4 illustrates a process of manufacturing a coplanar type thin film transistor according to the first embodiment of the present invention. In FIG. 4(a), on a glass substrate 401 on which an insulating film 412 is previously formed as a base, an applied film is formed at the rate of revolution of 500 rpm using as a liquid material a solution refined by filtering with a 1 μm filter the liquid material (high-order silane solution) after irradiating with TV rays of 20 mW/cm² having a wavelength of 308 nm for 20 minutes to a benzene solution of 50 ml containing 15 wt % of cyclopentasilane. Next, after carrying out a heat treatment at 100° C. for 20 minutes to remove the solvent of the applied film, a heat treatment is carried out again at 400° C. for 30 minutes to make the applied film into a metallic silicon film. Next, the laser annealing with an energy density of 300 mJ/cm² is carried out to form a polycrystalline silicon film. Next, island regions 402 which will become a source region, a drain region, and a channel region are formed through a photoetching method.

Although the island regions which will become the source region, the drain region, and the channel region has been formed out of a non-doped silicon film, a doped silicon film in which phosphor or boron has been doped may be used in order to control $V_{th}$ of the thin film transistor. For this purpose, a liquid material obtained by adding a material containing phosphor or boron, for example, decaborane or yellow phosphor to a benzene solution of cyclopentasilane and by irradiating the solution with UV rays is applied to form an applied film. Further, a heat treatment and a laser annealing treatment of the applied film are carried out under condition almost same as the one described above. Concentration of phosphor or boron in the doped silicon film can be controlled arbitrarily by controlling the amount of the additive or the irradiating condition of UV.

In order to control the concentration of phosphor or boron in the doped silicon film, a laminated film of the silicon film formed by heating the applied film containing the high-order silane and the doped silicon film formed by heating the applied film to which a material containing phosphor or boron is added may be used. By forming and then laser-annealing the laminated film, the dopant in the doped silicon film is diffused into the non-doped silicon film. The concentration of the dopant can be controlled by the thickness of the applied film and the laser annealing condition.

Next, as shown in FIG. 4(b), a gate insulating film 403 is formed out of a liquid material. First, a polyperhydrosilazane of 5% concentration containing xylene as a solvent is applied to the substrate at the rate of revolution of 1000 rpm to form the applied film having a film thickness of about 1000 Å. Next, by baking the applied film at 80° C. for 30 minutes to remove the solvent and then heating it at 350° C. for 60 minutes to denature it into an $SiO_2$ film, a gate insulating film 403 is formed. Although the heat treatment at 350° C. has been carried out in the atmosphere containing oxygen, it may be carried out in the atmosphere containing oxygen and water vapor, so that the electrical property of the gate insulating film or the interface property of MOS can be improved to enhance the reliability of the thin film transistor.

Next, a gate electrode 404 is formed out of a liquid material. A doped silicon film formed out of a liquid material or a metal film formed out of a dispersion solution of metallic fine particles or a metal film formed through a plating method may be used for the gate electrode 404. In this embodiment, the gate electrode is formed out of the dispersion solution containing Ag fine particles through the droplet ejection method. As the dispersion solution, a "Perfect Silver" (a brand by Vacuum Metallurgy Co.) manufactured by dispersing Ag fine particles having a diameter of 10 nm or less in toluene is used. An adjusting agent is mixed with the "Perfect Silver" to have the viscosity or surface tension suitable for the droplet ejection method, thereby forming an actual dispersion solution. The adjusted dispersion solution is ejected in a gate electrode pattern shape through the droplet ejection method to form an applied film, and subsequently the applied film is heated at a temperature between 100° C. to 300° C. to form the gate electrode 404 having a width of 30 μm.

Next, as shown in FIG. 4(c), the gate electrode is covered with a photoresist 413 and then the gate insulating film is removed using the photoresist 413 as a mask, to expose silicon films 405 and 406 which will become the source/drain regions.

Next, as shown in FIGS. 4(d) and 4(e), a doped silicon film 407 is formed through the droplet ejection method (ink jet; I/J) using a liquid material containing silicon atom and boron or phosphor. The doped silicon film 407 is formed to cover the exposed source/drain regions 405 and 406. In this embodiment, the liquid material (high-order silane solution) after irradiating with UV rays of 15 mW/cm² having a wavelength of 436 nm a solution obtained by adding yellow phosphor 150 mg to the benzene solution 50 ml containing 20 wt % of cyclohexasilane for 15 minutes is ejected in the source/drain regions through the droplet ejection method to form an applied film 414 made of doped silicon.

Next, the solvent is removed by heating the applied film 414 of the doped silicon at 100° C., the photoresist is removed thereafter and subsequently a heat treatment at 350° C. is carried out to make it into the doped amorphous silicon film. Subsequently, a laser annealing with XeCl is carried out. Through the laser annealing, the silicon film is made to be polycrystalline and phosphor constituting the doped silicon film 407 is diffused into the underlying silicon film to form the source/drain regions 405 and 406 made of n-type polycrystalline silicon.

Next, as shown in FIG. 4(f), an interlayer insulating film 410 is formed out of polyperhydrosilazane. First, a solution of 20% concentration is applied at a rate of revolution of 1000 rpm on the substrate to form an applied film. Next, xylene as a solvent is removed through the baking process at 80° C. and subsequently an SiO₂ film having a thickness of about 5000 Å is formed through the heat treatment at 350° C. Although the heat treatment at 350° C. has been carried out in the atmosphere containing oxygen, it may be carried out in the atmosphere containing oxygen and water vapor, so that the electrical property or the reliability of the gate insulating film can be further improved.

Next, after opening the interlayer insulating film to form a contact hole, source/drain electrodes 411 are formed out of the liquid material as shown in FIG. 4(g). As the liquid material used for formation of the electrodes, a dispersion solution obtained by dispersing metallic fine particles into an organic solvent or a solution obtained by dissolving organic compound containing indium and tin in organic solvent can be used. Further, the electrodes may be formed using a thin film made of nickel formed through the electroless plating. In forming a thin film transistor comprising a transparent conductive film for a liquid crystal display device, the transparent conductive film may be formed by using an organic compound containing indium and tin as a liquid material. In this embodiment, a dispersion solution obtained by dispersing metallic fine particles having a diameter of several tens of Å into the organic solvent has been used. The dispersion solution is applied using the droplet ejection method to form an applied film to be an electrode pattern and subsequently a heat treatment at 200° C. is carried out to make it into a conductive film, so that the electrode 411 is formed as shown in FIG. 4(g).

Second Embodiment

Figure 5:
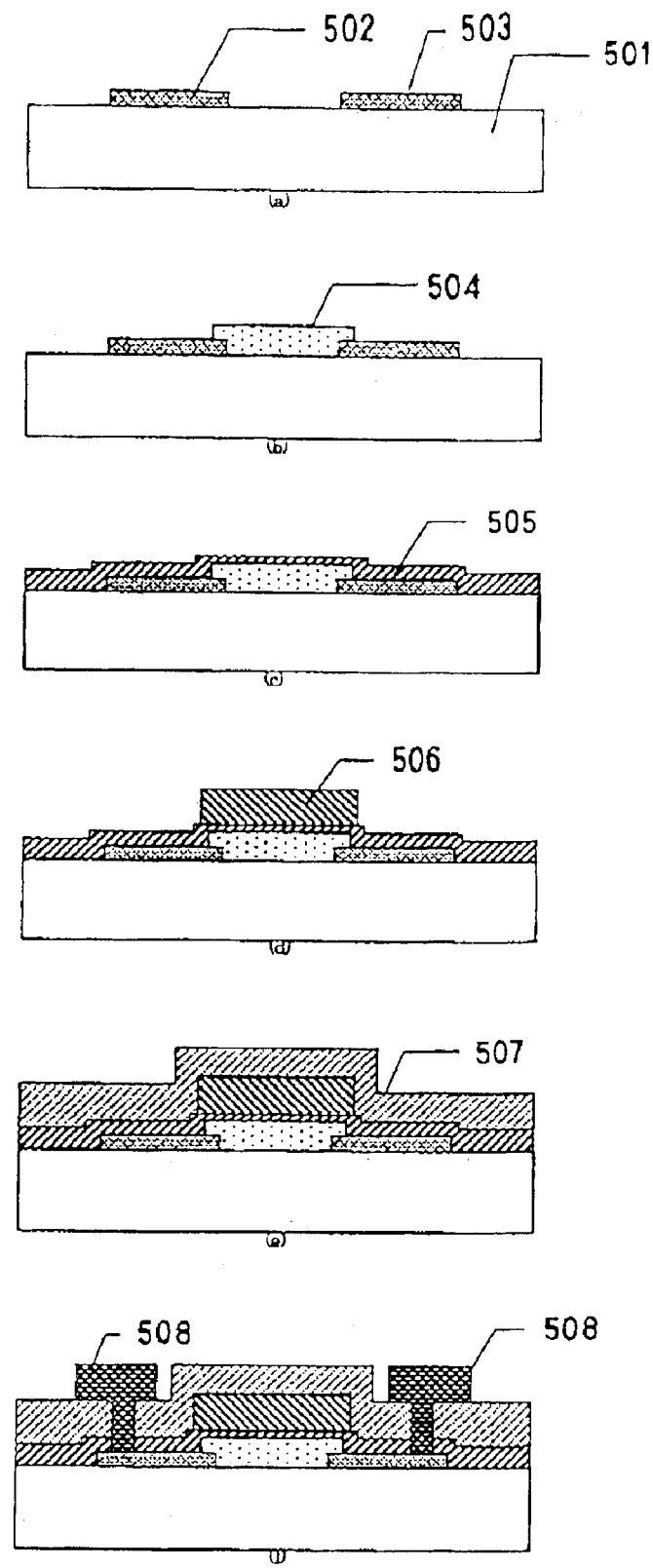
FIGS. 5a–5f are cross-sectional views illustrating a process of manufacturing a staggered thin film transistor according to a second embodiment of the present invention.

A second embodiment of the present invention is shown in FIG. 5. FIG. 5 illustrates a process of manufacturing a staggered type thin film transistor according to the present invention. In FIG. 5(a), reference numeral 501 indicates a glass substrate and reference numerals 502 and 503 indicate doped silicon films which will become the source/drain regions and which dopants are doped in. The formation of the doped silicon films is carried out as follows. That is, as liquid material (high-order silane solution) obtained by irradiating with UV rays of 15 mW/cm² having a wavelength of 436 nm for 15 minutes a toluene solution of 50 ml containing 30 wt % of cyclopentasilane, adding decaborane of 0.5 g to the solution and then filtering the resultant solution with a 0.5 μm filter, is applied to form an applied film. Subsequently after carrying out an heat treatment at 150° C. for 30 minutes to remove the solvent of the applied film, a heat treatment is carried out again at 350° C. for 30 minutes to make the applied film into the amorphous doped silicon film. Next, a laser annealing with an energy density of 300 mJ/cm² is carried out to form a polycrystalline doped silicon film. Next, it is patterned through photoetching to form source/drain regions 502 and 503.

Next, as shown in FIG. 5(b), a silicon film 504 which will become the channel region is formed. First, a liquid material (high-order silane solution) is manufactured by irradiating with UV rays of 10 mW/cm² having a wavelength of 308 nm for 10 minutes a solution obtained by dissolving a mixture of cyclopentasilane of 10 g and cyclohexasilane of 5 g in the benzene of 40 ml. The viscosity of this solution is 12 mpa·s. In order to adjust the viscosity, hexane of 50 ml is added to the solution and then the solution is filtered with a 0.2 μm filter. The viscosity of the high-order silane composition obtained by doing so is 3 mpa·s. An applied film is formed out of the high-order silane composition at the rate of revolution of 500 rpm. Next, by carrying out a heat treatment with the temperature slowly increased from 100° C. to 350° C., the solvent of the applied film is removed to make it into the amorphous silicon film, and by carrying out a laser annealing with an energy density of 250 mJ/cm² to form a polycrystalline silicon film. Next, as shown in FIG. 5(b), an island region 504 which will become the channel region is formed to be connected to the source/drain by using the photoetching.

Although the channel region has been formed out of a non-doped silicon film, a doped silicon film in which phosphor or boron has been doped may be used in order to control $V_{th}$ of the thin film transistor. For this purpose, a liquid material obtained by adding a material containing phosphor or boron to a mixture of cyclopentasilane and cyclohexasilane and irradiating the solution with UV rays is applied to the substrate and then a heat treatment is carried out to form a doped silicon film. The heating and the laser annealing are carried out under condition almost same as the one described above. Concentration of phosphor or boron in the doped silicon film can be controlled by the amount of the material containing phosphor or boron or the irradiating condition of UV.

In order to control the concentration of phosphor or boron in the doped silicon film, a laminated film of the silicon film formed by heating an applied film made of a high-order silane and a doped silicon film formed by heating an applied film to which a material containing phosphor or boron is added may be used. By forming and then laser-annealing the laminated film, the dopants in the doped silicon film are diffused into the non-doped silicon film. The concentration of the dopants can be controlled by each thickness of the laminated film and the laser annealing condition as well as the mixture ratio of phosphor or boron.

Next, as shown in FIG. 5(c), a gate insulating film 505 is formed out of a liquid material. First, a polyperhydrosilazane of 5% concentration is applied to the substrate at the rate of revolution of 1000 rpm to form an applied film having a thickness of about 1000 Å. Next, by heating the applied film at 350° C. for 30 minutes to denature it into an SiO₂ film, the gate insulating film 505 is formed.

Next, as shown in FIG. 5(d), a gate electrode is formed out of a dispersion solution containing Ag fine particles through the droplet ejection method. A doped silicon film formed out of a liquid material, a metal film formed out of a dispersion solution of metallic fine particles or a metal film formed through a plating method may be used for the gate electrode 404. In this embodiment, the dispersion solution of metallic fine particles is used for the gate electrode. As the dispersion solution, a "Perfect Silver" (a brand by Vacuum Metallurgy Co.) manufactured by dispersing Ag fine particles having a diameter of 10 nm or less in toluene is used. An adjusting agent is added to the "Perfect Silver" to have the viscosity or surface tension suitable for the droplet ejection method, thereby forming an actual dispersion solution. The adjusted dispersion solution is ejected in a gate electrode pattern shape through the droplet ejection method to form an applied film, and subsequently the applied film is heated at a temperature between 100° C. to 300° C. to form the gate electrode.

Next, as shown in FIG. 5(e), an interlayer insulating film 507 is formed out of the liquid material. Polyperhydrosilazane is used as the liquid material. First, a solution of 20% concentration is applied at a rate of revolution of 1000 rpm on the substrate to form an applied film. Next, the xylene as a solvent is removed through the baking process at 80° C. and subsequently an $SiO_2$ film having a thickness of about 5000 Å is formed through a heat treatment at 350° C. Although the heat treatment at 350° C. has been carried out in the atmosphere containing oxygen, it may be carried out in the atmosphere containing oxygen and water vapor, so that the electrical property and the reliability of the gate insulating film can be further improved.

Next, after opening an interlayer insulating film 507 to form a contact hole, an electrode 508 is formed out of the liquid material as shown in FIG. 5(f). As the liquid material used for formation of the electrodes, a dispersion solution obtained by dispersing metallic fine particles into an organic solvent or a solution obtained by dissolving an organic compound in organic solvent can be used. Further, the electrodes may be formed using a thin film made of nickel etc. formed through the electroless plating. In forming a thin film transistor comprising a transparent conductive film for a liquid crystal display device, the transparent conductive film may be formed by using an organic compound containing indium and tin as the liquid material.

In this embodiment, the electrode is formed out of an ITO film. First, a solution of 8% concentration using an organic compound containing indium and tin and xylene as a solvent is applied at a rate of revolution of 1500 rpm on the substrate to form an applied film. Next, the solvent is removed through a heat treatment at 80° C. and subsequently an ITO film having a thickness of about 2000 Å is formed through a heat treatment at 300° C. Next, an electrode 508 is formed through the photoetching as shown in FIG. 5(f). Furthermore, in the above heat treatment, a heat treatment at 300° C. is carried out for 30 to 60 minutes, the substrate is cooled to a temperature of 200° C., preferably to 150° C., in a reduction atmosphere containing hydrogen and then the substrate is taken out in atmosphere. By doing so, resistance of the ITO film can be further reduced. Furthermore, the above electrode is the transparent electrode and can be used as a pixel electrode required for the liquid crystal display device.

Third Embodiment

Figure 6:
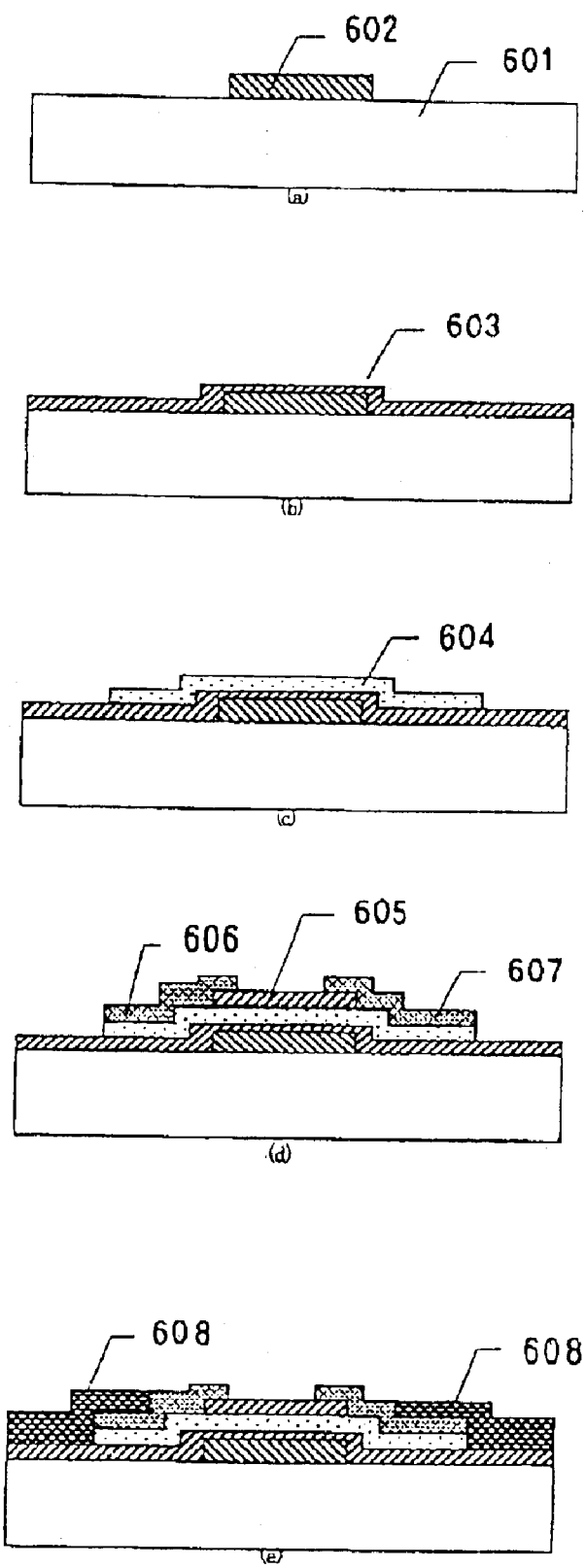
FIGS. 6a–6e are cross-sectional views illustrating a process of manufacturing an inversely-staggered type thin film transistor according to a third embodiment of the present invention.

A third embodiment of the present invention is shown in FIG. 6. FIG. 6 illustrates a process of manufacturing an inversely-staggered type thin film transistor according to the present invention. First, as shown in FIG. 6(a), a gate electrode 602 is formed on a glass substrate 601. In this embodiment, the gate electrode is formed through the electroless plating method. By using a sodium-free nickel plating solution as an plating solution, a nickel film having a film thickness of about 4000 Å is formed on the substrate. The growth of the nickel film is carried out by immersing the substrate in the plating solution so as to segregate nickel. As the pretreatment process thereof, the surface cleaning or the activator process of the substrate is carried out. Although a solution containing sodium is generally used in the pretreatment process, the sodium-free solution is also used for the pretreatment process in the present invention. The patterning of the nickel film is carried out through the conventional photoetching method. An etching solution for nickel comprises a mixture acid of acetic acid and glacial acetic acid.

Next, as shown in FIG. 6(b), a gate insulating film 603 is formed out of a liquid material. First, polyperhydrosilazane of 5% concentration is applied to the substrate at the rate of revolution of 1000 rpm to form an applied film having a film thickness of about 1000 Å. Next, by carrying out a heat treatment at 80° C. for removing the solvent of the applied film and then carrying out a heat treatment at 350° C. for 30 minutes to denature it into an $SiO_2$ film, the gate insulating film 603 is formed.

Next, as shown in FIG. 6(c), a silicon film 604 which will become the channel region is formed out of the liquid material. First, using the liquid material (high-order silane solution) manufactured by irradiating with UV rays of 10 mW/cm² having a wavelength of 436 nm for 20 minutes a solution obtained by dissolving a mixture of cyclopentasilane of 5 g and cyclohexasilane of 5 g in the benzene of 100 ml, the applied film is formed at the rate of revolution of 500 rpm. Next, the solvent is removed through the heat treatment at 150° C., the applied film is made to be the silicon film through a heat treatment at 300° C. for 30 minutes, and then a polycrystalline silicon film is formed through the laser annealing with an energy density of 250 mJ/cm².

When the amorphous silicon film is obtained after the heat treatment and the laser annealing process, the heat treatment is carried out at a temperature of 450° C. or higher and the laser annealing is not carried out, or the laser annealing is carried out under the condition that the laser energy is low. However, since the ratio of amorphousness or poly-crystallization or ratio in which silicon remains as the organic compound in the film depends upon the temperature and the time of the heat treatment, the wavelength and the energy density of UV rays used for photopolymerization and the film thickness of the applied film, these conditions are required to be optimized in order to produce a desired amorphous silicon film.

Next, as shown in FIG. 6(d), an insulating film 605 which will become the channel protective film and the doped silicon films 606 and 607 which will become the source/drain regions are formed out of liquid materials. The channel protective film can be formed out of, for example, polyperhydrosilazane in the same way as the gate electrode. In forming the doped silicon film which will become the source/drain regions, first, a liquid material (high-order silane solution) manufactured by irradiating with UV rays having a wavelength of 436 nm for 10 minutes a xylene solution of 50 ml containing 12 wt % of cyclopentasilane of 10 g is applied to form an applied film, the solvent in the applied film is removed through the heat treatment at 80° C. to 150° C. and the heat treatment at 350° C. is carried out for 30 minutes to form an amorphous the doped silicon film. Next, by carrying out the laser annealing with an energy density of 300 mJ/cm², the doped silicon film is made to be polycrystalline. During the laser annealing, the dopants are diffused into the non-doped silicon film below the doped silicon film. Next, the source/drain regions 606 and 607 are formed by pattering the film through the photoetching process.

Next, as shown in FIG. 6(e), an electrode 608 is formed out of the liquid material. In this embodiment, the electrode is formed out of an ITO film. First, a solution of 8% concentration using an organic compound containing indium and tin and xylene as a solvent is applied at a rate of revolution of 1500 rpm on the substrate to form an applied film. Next, the solvent is removed through a heat treatment at 80° C. and subsequently an ITO film having a thickness of about 2000 Å is formed through a heat treatment at 300° C. Next, the electrode 608 is formed through the photoetching as shown in FIG. 6(e). Furthermore, in the above heat treatment, the heat treatment at about 300° C. is carried out for about 30 to 60 minutes, the substrate is cooled to a temperature of about 200° C., preferably to 150° C., in the reduction atmosphere containing hydrogen and then the substrate is taken out in atmosphere. By doing so, resistance of the ITO film can be further reduced. Furthermore, the above electrode is the transparent electrode and can be used as a pixel electrode required for the liquid crystal display device.

EFFECTS OF THE INVENTION

In the method of manufacturing a device according to the present invention, all or a part of the thin films such as the silicon film, the insulating film, and the conductive film constituting a device such as a thin film transistor are formed by using liquid material. The desired thin film is mainly formed by applying the liquid material comprising a high-order silane composition to a substrate to form an applied film and heating the applied film.

Therefore, it is possible to solve various problems inherent to the conventional film formation method using the CVD method or the sputtering method and to manufacture a device at low cost using a small-sized and inexpensive apparatus, where the productivity is high, the defect is reduced, the production efficiency is high, the coating property in a stepped portion is excellent and the thin film is formed at low cost.

Furthermore, in the method of manufacturing a device according to the present invention, the silicon film of which the amount of doping has been controlled is formed by using liquid material. Therefore, since the ion implantation method using the expensive apparatus is not required for control of the doping to silicon film and the amount of doping, devices can be manufactured at low cost.

The entire disclosure of Japanese Patent Application No. 2002-119962 filed Apr. 22, 2002 is incorporated by reference.

What is claimed is:

1. A method of manufacturing a device comprising:
    forming individual thin films including a silicon film, a gate insulating film, a conductive film for a gate electrode, an interlayer insulating film, and a conductive film for an electrode and wiring,
    wherein a process of forming the silicon film comprises:
        a step of applying a liquid material to form an applied film; and
        converting the applied film into the silicon film with at least one of a heating and a light irradiating step; and
    wherein the liquid material includes a high-order silane composition, the high-order silane being formed by photopolymerization by irradiating a silane compound solution having a photopolymerization property with UV rays.

2. The method of manufacturing a device according to claim 1 wherein the individual thin films further comprise a transparent conductive film.

3. The method of manufacturing a device according to claim 2, wherein the step of forming the transparent conductive film comprises a step of applying an organic compound containing indium and tin on the substrate to form a second applied film; and a heating step for making the second applied film into an Indium-Tin-Oxide film.

4. The method of manufacturing a device according to claim 1, wherein the step of converting with at least one of heating and light irradiating comprises a first step for making the applied liquid material into an amorphous silicon film and a second step for making the amorphous silicon film into a polycrystalline silicon film.

5. The method of manufacturing a device according to claim 4, wherein the first step comprises a step of irradiating light having a wavelength of 170 nm to 380 nm.

6. The method of manufacturing a device according to claim 4, wherein the first step comprises a step of removing a solvent contained in the applied film formed by the liquid material and a step for making the applied film into the amorphous silicon film by heating the applied film at a temperature higher than that used in the step of removing the solvent.

7. The method of manufacturing a device according to claim 4, wherein the second step comprises a step of heating at a high temperature for a short time with intense light.

8. The method of manufacturing a device according to claim 7, wherein the step of heating at a high temperature for a short time with intense light is carried out in an oxygen-free atmosphere.

9. The method of manufacturing a device according to claim 1, the process of forming the silicon film comprising the step of applying the liquid material to form the applied film and the converting step for making the applied film into the silicon film, wherein all the steps are carried out in an oxygen-free atmosphere.

10. The method of manufacturing a device according to claim 9, wherein the oxygen-free atmosphere has an oxygen concentration of 10 ppm or less.

11. The method of manufacturing a device according to claim 1, wherein the step of forming the gate insulating film comprises a step of applying polyperhydrosilazane on the substrate; and a step for making the applied polyperhydrosilazane into an $SiO_2$ film through a heat treatment.

12. The method of manufacturing a device according to claim 1, wherein the step of forming the gate electrode comprises a step of applying a metal-containing liquid material on the substrate to form a second applied film; and a step for making the second applied film into a metal film through a heat treatment.

13. The method of manufacturing a device according to claim 1, wherein the step of forming the gate electrode comprises a step of forming a metal film on the substrate through a plating method.

14. The method of manufacturing a device according to claim 1, wherein the step of forming the gate electrode comprises a step of applying an organic compound containing indium and tin on the substrate to form an applied film; and a heating step for making the applied film into an Indium-Tin-Oxide film.

15. The method of manufacturing a device according to claim 1, wherein the step of forming the interlayer insulating film comprises a step of applying polyperhydrosilazane on the substrate; and a step for making the polyperhydrosilazane into an $SiO_2$ film through a heat treatment.

16. The method of manufacturing a device according to claim 1, wherein the step of forming the electrode and the wiring comprises a step of applying a metal-containing liquid material on the substrate to form a second applied film; and a step for making the second applied film into a metal film through a heat treatment.

17. A The method of manufacturing a device according to claim 1, wherein the step of forming the electrode and the wiring comprises a step of forming a metal film on the substrate through a plating method.

18. The method of manufacturing a device according to claim 1, wherein the step of forming the electrode and the wiring comprises a step of applying an organic compound containing indium and tin on the substrate to form a second applied film; and a heating step for making the second applied film into an Indium-Tin-Oxide film.

19. The method of manufacturing a device according to claim 1, wherein the high-order silane composition used as the liquid material comprises a high-order silane having a boiling point and a decomposing point, the boiling point being higher than the decomposing point.

20. The method of manufacturing a device according to claim 19, wherein the high-order silane composition is formed by using UV rays having a wavelength at which the solvent used in the silane compound solution is not decomposed.

21. The method of manufacturing a device according to claim 19, wherein the high-order silane composition is formed by irradiating with UV rays for 0.1 seconds to 120 minutes.

22. The method of manufacturing a device according to claim 19, wherein the high-order silane composition is formed using a compound having at least one ring-shaped structure within a molecule as the silane compound.

23. The method of manufacturing a device according to claim 19, wherein the high-order silane composition is formed using a compound expressed as a general formula $Si_nX_{2n}$ (where X represents a at least one of a hydrogen atom and a halogen atom and n represents an integer of 3 or more).

24. The method of manufacturing a device according to claim 19, wherein the high-order silane composition is formed by adding at least one of a material containing a Group IIIB element and a material containing a Group VB element.

25. The method of manufacturing a device according to claim 1, wherein all of the thin films are formed using liquid materials and all of the thin films are formed without using a vacuum apparatus.

26. The method of manufacturing a device according to claim 1, wherein all of the thin films are formed using liquid materials and all of the thin films are formed under atmospheric pressure.

27. The method of manufacturing a device according to claim 1, wherein all of the thin films are formed using liquid materials, and at least the silicon film, the conductive film for the gate electrode and the conductive film for the electrode and wiring are formed isolatedly by using a droplet ejection method.

28. A method of manufacturing a device, comprising:
   a step of applying a liquid material on an insulator to form an applied film;
   a step of converting the applied film into a silicon film by at least one of heating and light irradiating;
   a step of patterning the silicon film to form isolated regions which will become a source, a drain, and a channel;
   a step of forming a gate insulating film on the silicon film;
   a step of forming a gate electrode on the gate insulating film;
   a step of forming a doped silicon film which will become source/drain regions;
   a step of forming an interlayer insulating film over the gate electrode and the source/drain regions;
   a step of opening the interlayer insulating film to form a contact hole; and
   a step of forming an electrode and wiring at the contact hole,
   wherein the liquid material includes a high-order silane compositions, the high order silane composition being formed by photopolymerization by irradiating a silane compound solution having a photopolymerization property with UV rays.

29. A method of manufacturing a device, comprising:
   a step of forming a dopant-containing semiconductor layer which will become source/drain regions, on an insulator;
   a step of applying a liquid material on the insulator to form an applied film;
   a step of converting the applied film into a silicon film by at least one of heating and light irradiating;
   a step of patterning the silicon film to form an isolated region which will become a channel region connected to the source/drain regions;
   a step of forming a gate insulating film over the channel and source/drain regions;
   a step of forming a gate electrode on the gate insulating layer;
   a step of forming an interlayer insulating film over the gate electrode;
   a step of opening the interlayer insulating film to form a contact hole; and
   a step of forming an electrode and wiring at the contact hole,
   wherein the liquid material includes a high-order silane composition, the high order silane composition being formed by photopolymerization by irradiating a silane compound solution having a photopolymerization property with UV rays.

30. A method of manufacturing a device, comprising:
   a step of forming a gate electrode on an insulator;
   a step of forming a gate insulating film on the gate electrode;
   a step of applying a liquid material on the insulator to form an applied film;
   a step of converting the applied film into a silicon film by at least one of heating and light irradiating;
   a step of forming a dopant-containing semiconductor layer which will become source/drain regions on the silicon film; and
   a step of forming an electrode and wiring at the source/drain regions,
   wherein the liquid material includes a high-order silane compositions, the high-order silane composition being formed by photopolymerization by irradiating a silane compound solution having a photopolymerization property with UV rays.

31. A method of manufacturing a thin film transistor, comprising:
   providing a liquid material including a high-order silane composition, said high-order silane composition formed by irradiating a silane compound solution with light; and
   converting said liquid material into a silicon film by irradiating said liquid material with light, or by heating said liquid material.

* * * * *